United States Patent [19]

Scott

[11] Patent Number: 5,220,483
[45] Date of Patent: Jun. 15, 1993

[54] TRI-LEVEL CAPACITOR STRUCTURE IN SWITCHED-CAPACITOR FILTER

[75] Inventor: Jeffrey W. Scott, Austin, Tex.
[73] Assignee: Crystal Semiconductor, Austin, Tex.
[21] Appl. No.: 821,034
[22] Filed: Jan. 16, 1992
[51] Int. Cl.$^5$ .................... H01G 4/10; H01L 27/02
[52] U.S. Cl. ....................................... 361/313; 257/528
[58] Field of Search ............... 361/311, 312, 313, 320, 361/321; 357/41, 51, 54, 23.6; 437/47, 52, 57, 60

[56] References Cited

U.S. PATENT DOCUMENTS

| | | | |
|---|---|---|---|
| 4,849,662 | 7/1989 | Holberg et al. | 307/520 |
| 4,949,154 | 8/1990 | Haken | 357/54 |
| 5,032,892 | 7/1991 | Chern et al. | 357/51 |
| 5,093,774 | 3/1992 | Cobb | 361/321 X |
| 5,110,766 | 5/1992 | Maeda et al. | 437/228 |
| 5,116,776 | 5/1992 | Chan et al. | 437/52 |

*Primary Examiner*—Donald A. Griffin
*Attorney, Agent, or Firm*—Gregory M. Howison

[57] ABSTRACT

A tri-level capacitor structure includes a first shielded metal layer (36) that is disposed between an upper metal layer (38) and a lower polysilicon layer (34). The shielded metal layer (36) is separated from the polysilicon layer (34) by an oxide layer (42), and the upper metal layer (38) is separated from the shielded layer (36) by an oxide layer (44). The upper metal layer (38) and the polysilicon layer (34) are connected together to a node (48) to form an Insensitive Node, whereas the shielded layer (36) is connected to a node (46) that is referred to as the Sensitive Node (S). The capacitor structure is operable to be connected in a switched-capacitor configuration in a lossy integrator, such that the Sensitive Node is connected to the virtual ground of a differential amplifier (50). The integrator utilizing this configuration would be comprised of at least one switched-capacitor (56) on the input that has the plates thereof connected between ground and either an input signal $V_{IN}$ or the inverting input of the differential amplifier (50) through control switches (62) and (64). The Sensitive Node associated with node (46) is connected to the switch (62) such that it is connected between ground and the inverting input of amplifier (50).

20 Claims, 3 Drawing Sheets

TRI-LEVEL CAPACITOR STRUCTURE IN SWITCHED-CAPACITOR FILTER

TECHNICAL FIELD OF THE INVENTION

The present invention pertains in general to multi-level capacitors and, more particularly, to a multi-level capacitor having one shielded node that is operable to be attached to the sensitive node in a switched-capacitor structure.

BACKGROUND OF THE INVENTION

Switched-capacitor structures typically utilize a plurality of capacitors having the plates thereof switched from the input of a differential amplifier to another voltage or to the output of a previous stage, which also incorporates the output of a differential amplifier. These capacitors are normally formed on an integrated circuit from a combination of semiconductor material, metal and oxide. Typically, the semiconductor material is incorporated as a bottom plate of the capacitor and, as such, this type of capacitor suffers from a large voltage co-efficient, due to semiconductor depletion/accumulation. These capacitors are normally avoided in high precision switched-capacitor filters and capacitor-array data converters.

Another type of capacitor that has been utilized in switched-capacitor structures is a poly-to-poly capacitor which is described in U.S. patent application Ser. No. 455,171, filed Dec. 22, 1989 and entitled "Compensated Capacitors for Switched-Capacitor Input of an Analog-to-Digital Converter" and U.S. Pat. No. 4,918,454, which are incorporated herein by reference. This type of capacitor has gained wide acceptance among analog MOS designers due to an extremely low voltage co-efficient that results from the compensation of one plate's depletion by the other plate's accumulation. The disadvantage of the poly-to-poly capacitor is the additional processing required to deposit a second polysilicon layer and grow a thin oxide layer for the capacitor dielectric.

One type of capacitor, a metal-to-metal polysilicon capacitor, is described in C. Kaya, H. Tigeliaar, J. Paterson, M. DeWit, J. Fattaruso, D. Hester, S. Kiriakai, K. Tan and F. Tsay, "Polycide/Metal Capacitors for High Precision A/D Converters", IEDM, 1988, pp. 782–785, which is incorporated herein by reference. These capacitors display a voltage coefficient approaching that of the poly-to-poly capacitor, particularly if the polysilicon is silicided. However, the relatively thick oxide that exists between the metal and polysilicon layers in standard MOS processing technology forces the designer to accept a plate area substantially greater than poly-to-poly types of comparable capacitance value.

In a switched-capacitor network, certain capacitor plates are particularly sensitive to stray noise coupling. Typically, the plates are in some manner connected to virtual ground. To reduce the noise sensitivity, the top plate of a two-plate capacitor structure is used as a sensitive "virtual ground" capacitor plate, so that the bottom plate can shield the sensitive node from substrate noise. However, two-plate capacitors implemented in this manner are still susceptible to noise coupling onto the sensitive top plate through passivation and packaging dielectrics.

SUMMARY OF THE INVENTION

The present invention disclosed and claimed herein comprises a switched-capacitor structure in an integrated circuit. A semiconductor substrate is provided, having a first face on which the integrated circuit is formed. A device having a virtual ground node is formed on the first face of the semiconductor structure, in addition to the capacitor. The capacitor includes a first conductive layer disposed over the first face of the semiconductor substrate, and separated therefrom by a first insulating layer. A second conductive layer is disposed over a portion of the first conductive layer and separated therefrom by a second insulating layer. A third conductive layer is disposed over a portion of the second conductive layer and separated therefrom by a third insulating layer. The second conductive layer comprises the first plate of the capacitor and is connectable to the virtual ground node of the device. The first and third conductive layers are connected together to comprise the other plate of the capacitor and are operable to shield the first plate of the capacitor, the second conductive layer, from noise resulting from external sources or from the semiconductor substrate.

In another aspect of the present invention, the second and third conductive layers are fabricated from metal in a two metal CMOS process. The first conductive layer is formed from a layer of polysilicon that is doped to a predetermined level of impurities.

In yet another aspect of the present invention, the first connecting device is comprised of a switch, which is operable to switch the first plate of the capacitor between the virtual ground node of the device and a predetermined reference in a switched-capacitor mode of operation. Similarly, the other plate of the capacitor is also switched between an input signal and a reference voltage. The preferred reference voltage is ground.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1:
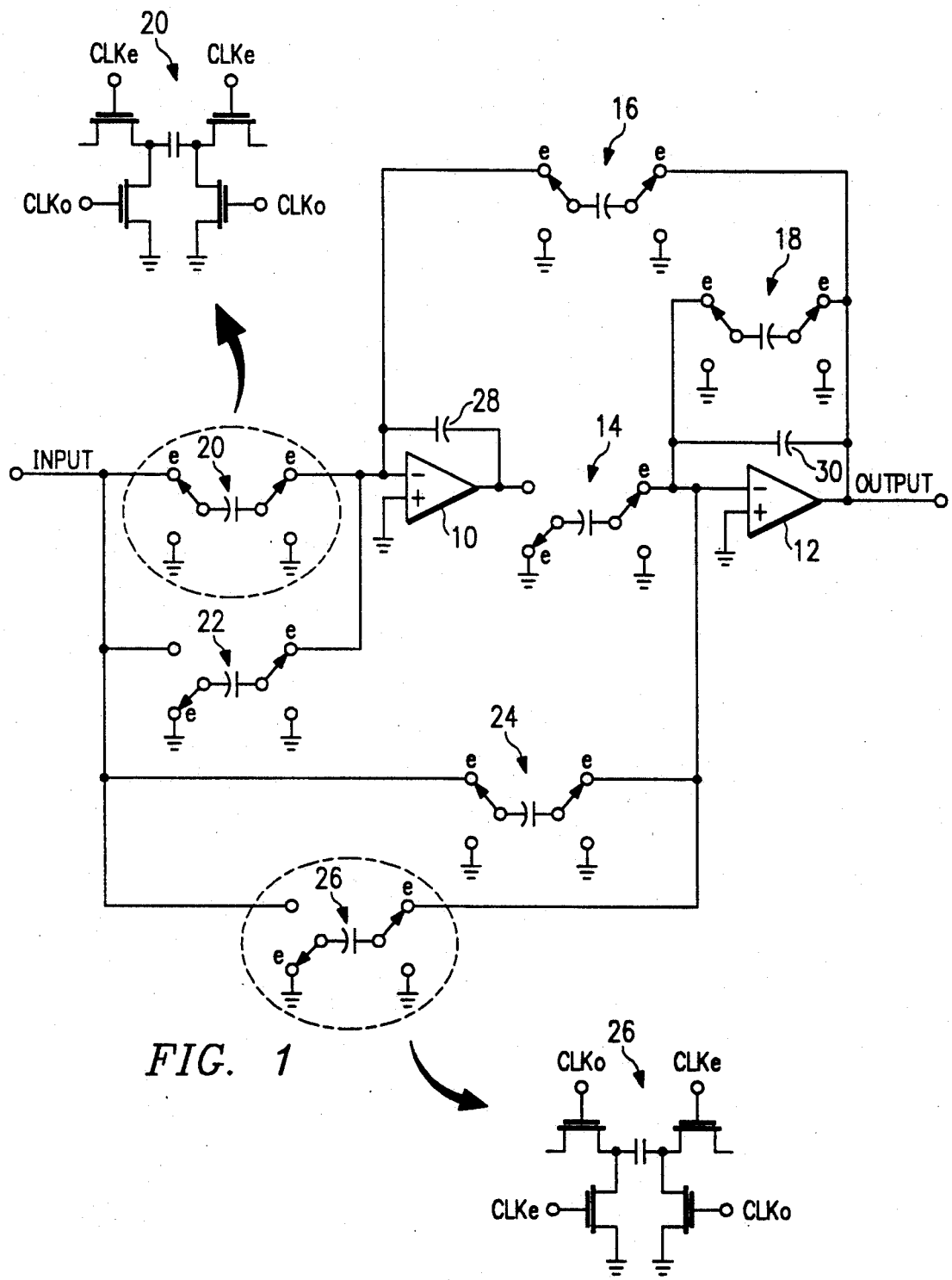
FIG. 1 illustrates a conventional biquad switched-capacitor filter.

Referring now to FIG. 1, there is illustrated a logic diagram of a conventional biquad switched-capacitor filter which is described in U.S. Pat. No. 4,849,662, issued to Holberg, et al., on Jul. 18, 1989 and assigned to Crystal Semiconductor Corporation. Two differential amplifiers 10 and 12 are provided, each having the positive input thereof connected to ground. The filter includes seven switched-capacitors 14, 16, 18, 20, 22, 24 and 26. Each terminal of each of the switched-capacitors 14–26 may be connected either to ground or to a signal node in response to clock signal CLK, CLKe and CLKo. The signals CLKe and CLKo are even and odd non-overlapping clock phases which run continuously. These clock phases are typically operated at a frequency of at least ten times higher than the highest frequency allowed for the INPUT signal. For a given clock frequency, the transfer characteristic of the circuit is substantially determined by capacitance ratios. A selection of proper values for the capacitor permits the realization of low-pass, high-pass, band-pass, band-reject, and other types of filters. For many of the possible filters, it is not necessary to include every type of switched-capacitor; for example, it is generally only necessary to include either the switched-capacitor 22 or the switched-capacitor 26, but not both. Accordingly, in the conventional biquad, switched-capacitor filter of the type illustrated in FIG. 1, no more than six switched-capacitors are typically required.

As illustrated, the amplifier 10 has a feedback capacitor 28 disposed between the inverting input and the output. The switched-capacitor 20 is connected between the INPUT signal and the inverting input of the amplifier 10. Further, the switched-capacitor 22 is also connected between the INPUT signal and the inverting input of the amplifier 10. The switched-capacitor 14 is connected between the output of the differential amplifier 10 and the inverting input of differential amplifier 12. The switched-capacitor 24 is connected between the INPUT signal and the inverting input of amplifier 12, as is the switched-capacitor 26. The differential amplifier 12 has a feedback capacitor 30 connected between the inverting input and the output thereof and also the switched-capacitor 18 is connected between the inverting input and output of differential amplifier 12.

There are two configurations of the switched-capacitor. In one configuration, illustrated by the detail of switched-capacitor 20, the switches are configured such that both plates of the capacitor are connected to ground or to the other terminals. For example, switched-capacitor 20 is controlled by a CLKe signal to connect both plates of the capacitor such that the capacitor is disposed in series between the input signal and the non-inverting input of the capacitor 10. In the next phase, the switches controlled by the CLKe signal are opened and the switches controlled by a CLKo signal are placed in a conductive mode and the plates connected to ground. In another configuration, illustrated in a detail of the switched-capacitor 26, the plates are alternately connected to ground, with one plate connected to ground while the other plate is connected to the non-ground terminal. In one mode, the CLKe signal will connect the plate of the capacitor to ground and the other plate of the capacitor to the inverting input of amplifier 12 and, in the other mode, the CLKo signal will connect the one plate to the INPUT signal and the other plate thereof to ground.

Figure 2:
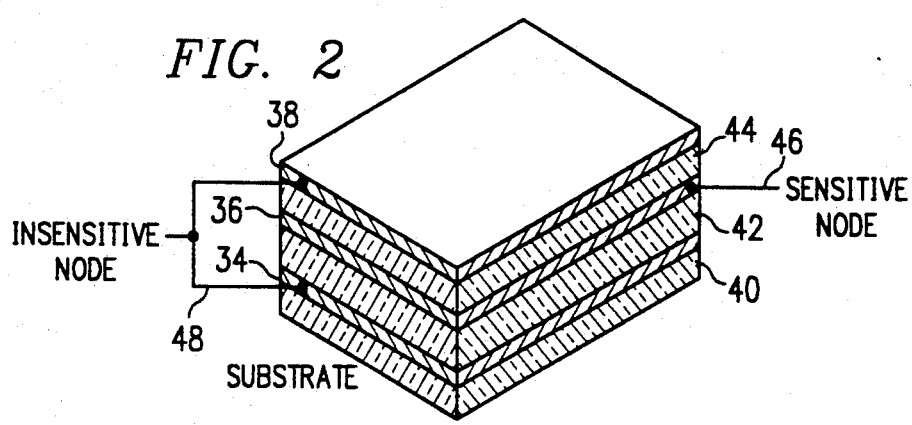
FIG. 2 illustrates a simplified diagram of the capacitor structure.
Figure 3:
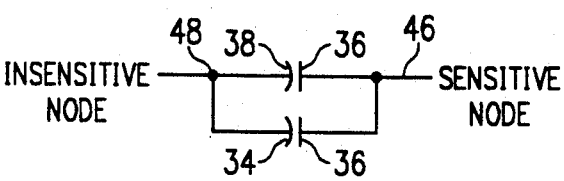
FIG. 3 illustrates the equivalent circuit of the structure of FIG. 2.

Referring now to FIG. 2, there is illustrated a simplified structural diagram of the shielded capacitor of the present invention. The capacitor is comprised of three plates, a lower plate 34, an intermediate shielded plate 36 and an upper plate 38. The lower plate 34 is comprised of polysilicon material, which is disposed above a substrate by a layer of oxide 40. The plate 36 is a metal layer that is separated from the polysilicon plate 34 by a layer of oxide 42. The upper plate 38 is comprised of a metal layer that is separated from the shielded plate 36 by a layer of oxide 44. The shielded plate 36 is referred to by the terminology "Sensitive Node" and is connected to a single terminal 46. The upper plate 38 and lower plate 34 are connected together and to a node 48, referred to as the "Insensitive Node", The upper metal plate 38 is operable to shield the shielded plate 36 from noise resulting from signals that are disposed above the plate 38. Similarly, the plate 34 is operable to shield the shielded plate 36 from substrate noise, as this noise cannot be coupled through the dielectric layer 40 to the plate 36. The equivalent circuit for the structure is illustrated in FIG. 3.

Figure 4:
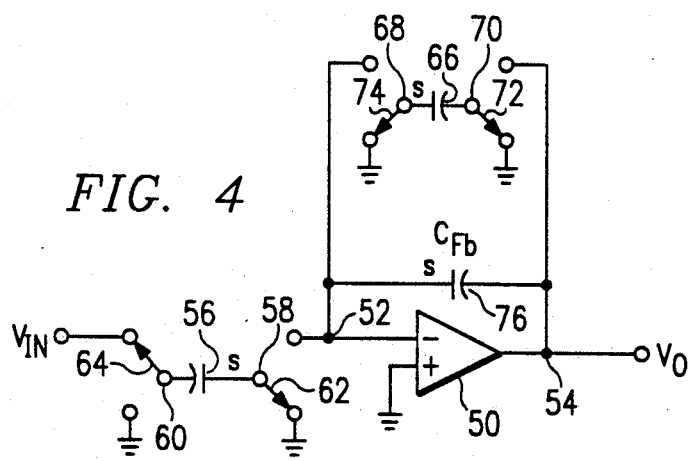
FIG. 4 illustrates a logic diagram of a lossy integrator stage utilizing the switched-capacitors of the present invention.

Referring now to FIG. 4, there is illustrated a logic diagram for a lossy integrator utilizing the capacitor structure of the present invention. The structure is comprised of a differential amplifier 50, having the non-inverting input connected to ground and the inverting input connected to a node 52. The output thereof is connected to a node 54. A first switched-capacitor 56 has two plates connected to nodes 58 and 60. Node 58 is connected to the shielded plate 36 of the capacitor and is designated as the Sensitive Node by the terminology "S". The node 58 is connected to a switch 62 and the node 60 is connected to a switch 64. Switch 62 is operable to be connected either to ground or to the node 52, whereas the switch 64 is operable to be connected to ground or an input node labelled $V_{IN}$. The switches are configured similar to switched-capacitor 26 in that the control signals therefor are operable to connect switch 64 to $V_{IN}$ when switch 62 is connected to ground. The switches 62 and 64 are configured with MOS transistors or similar structures.

A second switched-capacitor 66 is provided that is connected in feedback between the inverting input of amplifier 50 and the output thereof. The two plates of the capacitor 66 are connected between a node 68 and a node 70. The sensitive plate of the capacitor is designated with the terminology "S" and is connected to node 68. Node 70 is connected to a switch 72 that is operable to switch between ground and the output of differential amplifier 50. Node 68 is connected to a switch 74 that is operable to be connected between ground and the inverting input of amplifier 50. Switches 72 and 74 are configured similar to the switches associated with switched-capacitor 20 of FIG. 1, in that both plates of the capacitor 66 are either connected to ground or to the terminal of the switches 72 and 74 to be connected between the non-inverting input of amplifier 50 and the output thereof.

A feedback capacitor 76 is connected between the node 52 and the node 54 in feedback with the differential amplifier 50, such that the Sensitive Node associated with shielded plate 36 is connected to node 52, and the two plates 34 and 38 are connected to the node 54. It can be seen that the sensitive plates of the capacitors 56 and 66 are always connected through either switch 62 or 74, respectively, to the node 52, which node 52 comprises the virtual ground of the differential amplifier 50, and the most Sensitive Node thereof. This is also true with respect to capacitor 76.

Figure 5:
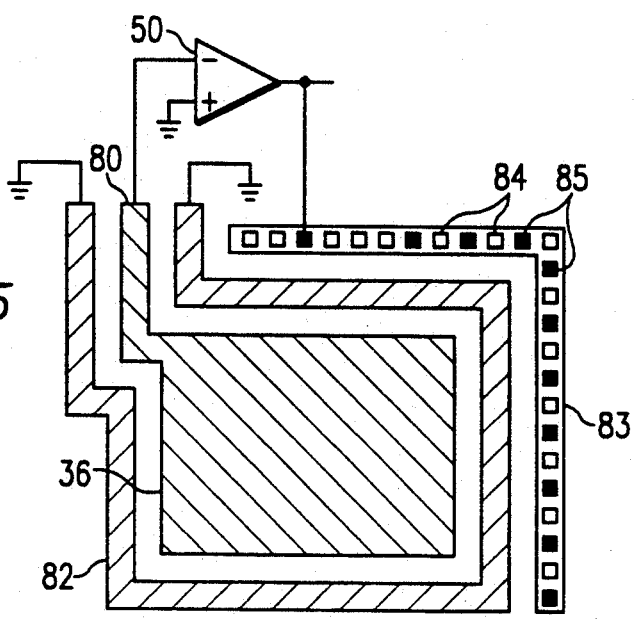
FIG. 5 illustrates a top view of the capacitor at the shielded plate level.

Referring now to FIG. 5, there is illustrated a top view of the capacitor structure at the level of the shielded plate 36. The shielded plate 36 is illustrated as a plate having a connection device 80 extending therefrom for connection to a sensitive node of the circuit to which it is associated with. In FIG. 5, this illustrated as the negative input of the amplifier 50. A grounded conductive ring 82 is disposed about the periphery of the shielded plate 36. The conductive ring 82 is formed from the same metal layer as the shielded plate 36 and, therefore, is in substantially the same plate. Contacts 85 are disposed through the oxide layer 42 in openings 87 from the lower plate 34, while vias 84 are disposed through the oxide layer 44 in openings 88 from the upper plate 38. The conductive ring 82 is disposed between the contacts 84 and 85, and the shielded plate 36 to substantially eliminate stray capacitance between plate 34 and sensitive plate 36. The conductive layer 82 is connected to ground through a contact elsewhere on the integrated circuit (not shown).

Figure 6:
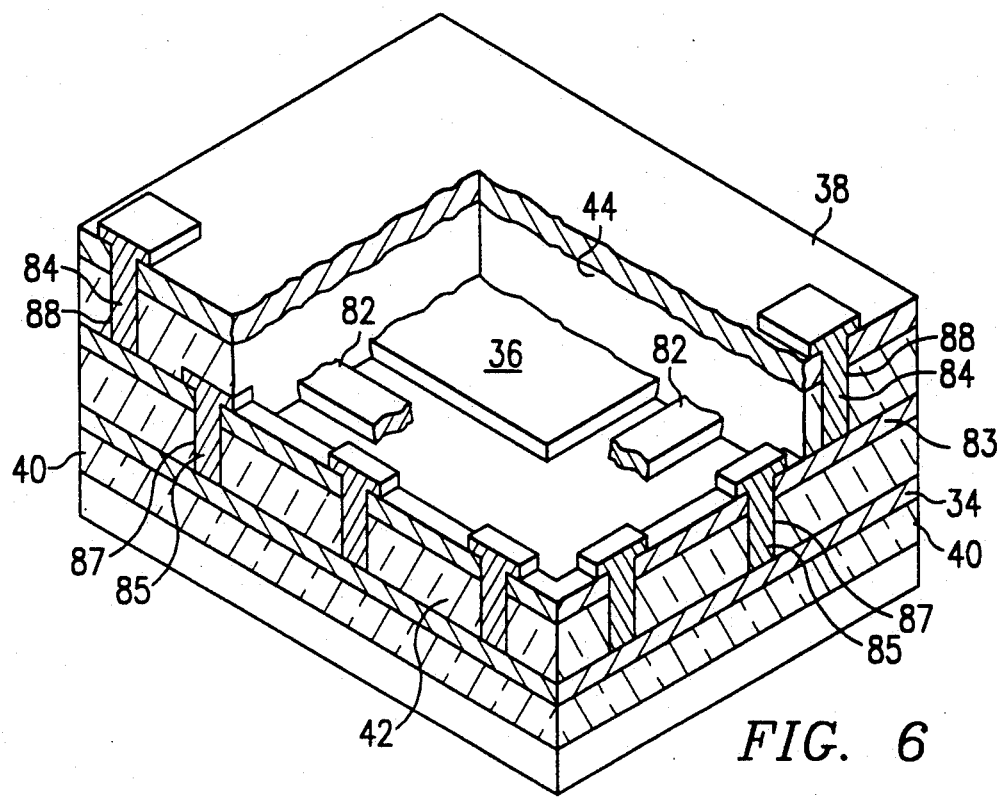
FIG. 6 illustrates a cross-sectional view of the structure of the capacitor of the present invention utilizing the MOS two-metal process.

Referring now to FIG. 6, there is illustrated a sectional diagram of the fabricated capacitor of the present invention utilizing the two-metal MOS process. The device is fabricated by first forming the transistors and other associated structures on the face of the semiconductor substrate. During processing, the oxide layer 40 is formed as a field oxide layer. Field oxide layers are typically utilized to separate active regions in the substrate. The field oxide layer 40 is typically around 4,000 Angstroms thick. A single layer of polysilicon is then disposed over the substrate to a thickness of approximately 3,400 Angstroms. This layer is then patterned and etched to form the gates of transistors, various interconnects, etc. and also the plate 34. A layer of interlevel oxide is then disposed on the substrate which forms the layer of oxide 42, this layer being approximately 6,000 Angstroms thick. The oxide layer 42 is then etched to provide vias 87 between plate 34 and plate 36. A layer of metal, such as aluminum, is then disposed over the substrate in a conformal manner to a thickness of approximately 0.6 micrometers. This is then patterned and etched to form various interconnections on the substrate, and also the shielded plate 36 and the conductive ring 82 and contacts 85. The etching is such that the plate 36 is disposed over the plate 34 and the conductive ring 82 is disposed around the periphery of the plate 36, as illustrated in FIG. 5. In addition to the conductive ring 82, an intermediate interconnection strip 83 is also formed in this layer. The interconnection strip 83 is utilized at the first metal layer to provide for interconnection to the poly layer at the lower plate 34 through contacts 85 and also used to interconnect between the second metal layer and the first metal layer through vias 87 to allow connection from the strip 83 upwards to the plate 38 metal layer.

After the first layer of metal is patterned and etched, a second layer of interlevel oxide is disposed over the substrate to a thickness of approximately 6,000 Angstroms and vias 88 etched therein. This layer of oxide will conformally coat the substrate. A second layer of metal, such as aluminum, is then disposed over the substrate in a conformal manner to a thickness of approximately 1.0 micrometer and filling the vias 88 to form contacts 84. This layer is then patterned to form various interconnects, etc. on the substrate and then etched.

Referring now to FIG. 6, there is illustrated a perspective view of the capacitor structure of FIG. 5.

Figure 7:
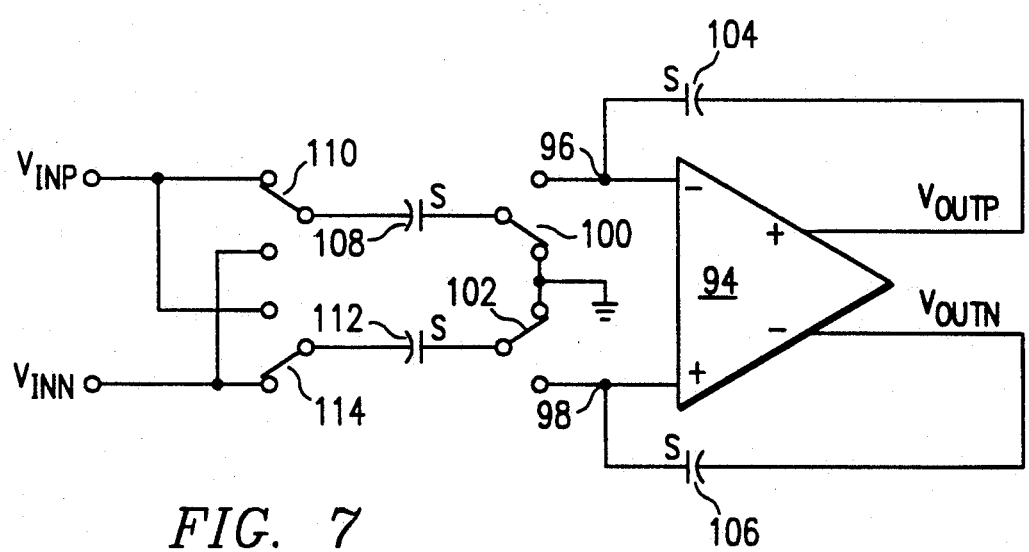
FIG. 7 illustrates a logic diagram of a fully differential integrator utilizing the capacitor structure of the present invention.

Referring now to FIG. 7, there is illustrated a logic diagram of a fully differential switched-type capacitor integrator utilizing the capacitor structure of the present invention. A differential amplifier 94 has the negative input terminal thereof connected to a node 96 and the positive input terminal thereof connected to a node 98. The node 96 is connected to one terminal of a switch 100, the other terminal of which is connected to ground. Similarly, the node 98 is connected to one terminal of a switch 102, the other terminal of which is connected to ground. Node 96 is also connected to the sensitive plate of a feedback capacitor 104, the other plate of which is connected to the positive output of amplifier 94. Similarly, node 98 is connected to the sensitive plate of a feedback capacitor 106, the other plate of which is connected to the negative output of amplifier 94. A switched-capacitor 108 has the sensitive plate thereof connected to the wiper of switch 100 and the other plate thereof connected to the wiper of a switch 110. One terminal of switch 110 is connected to a positive input voltage and the other terminal thereof is connected to a negative input voltage. A switched-capacitor 112 has the sensitive plate thereof connected to the wiper of the switch 102 and the other plate thereof connected to the wiper of a switch 114. One terminal of switch 114 is connected to the negative input and the other terminal thereof is connected to the positive input.

Switched-capacitors 108 and 112 both have a sensitive input thereof connected to the wipers of the respective switches 100 and 102. In operation, the switches 100 and 102 are clocked by a common clock to be connected to ground or to the respective nodes 96 and 98. The other side of the capacitors 108 and 112 are controlled by switches 110 and 114 such that the other side of capacitor 108 is connected to the positive input when the other side of capacitor 112 is connected to the negative input. On the other cycle of the clock, the other side of capacitor 108 is connected to the negative input and the other side of capacitor 112 is connected to the positive input.

In summary, there has been provided a multiple level capacitor structure wherein one of the layers is a shielded plate. This shielded plate is disposed between two conductive layers which are interconnected about the periphery to both isolate the shielded plate from substrate noise and also from external noise. The shielded plate is typically connected to the sensitive node of an integrated circuit in a switched-capacitor type configuration. To further isolate the shielded plate, a conductive guard ring is disposed about the periphery of the shielded plate and connected to ground and disposed in substantially the same plane as the shielded plate.

Although the preferred embodiment has been described in detail, it should be understood that various changes, substitutions and alterations can be made therein without departing from the spirit and scope of the invention as defined by the appended claims.

What is claimed is:

1. A capacitor structure in an integrated circuit, comprising:
   a semiconductor substrate having a first face upon which the semiconductor integrated circuit is formed;
   a subcircuit having a virtual ground node, said subcircuit formed on the first face of said semiconductor substrate; and
   a capacitor having first and second plates formed on the first face of said semiconductor substrate, said capacitor having:
      a first conductive layer disposed over a portion of the first face of said semiconductor substrate and separated therefrom by a first insulating layer, a second and shielded conductive layer disposed over a portion of said first conductive layer and separated therefrom by a second insulating layer, a third conductive layer disposed over a portion of said second and conductive layer and separated therefrom by a third insulating layer, a first connecting device for connecting said second conductive layer to said virtual ground node of said subcircuit, said second conductive layer comprising the first plate of said capacitor, a second connecting device for connecting said first and third conductive layers together to form the second plate of said capacitor and to shield the portion of said second conductive layer disposed therebetween from noise and external signals, and a fourth conductive layer disposed in substantially the same plane as said second shielded conductive layer and disposed a predetermined distance therefrom and a third connecting device for connecting said fourth conductive layer to a predetermined voltage.

2. The capacitor structure of claim 1, wherein said first conductive layer is comprised of a silicon-based material.

3. The capacitor structure of claim 1, wherein said first conductive layer is comprised of polycrystalline silicon.

4. The capacitor structure of claim 3, wherein said polycrystalline silicon is doped with a predetermined level of impurities.

5. The capacitor structure of claim 1, wherein said second and third conductive layers are comprised of a metal layer formed with a two-metal CMOS process.

6. The capacitor structure of claim 1, wherein said second connecting device is operable to connect said first and third conductive layers to the output of said subcircuit, such that said capacitor is disposed in a feedback configuration.

7. The capacitor structure of claim 1, wherein said first connecting device comprises a switching device for switching the first plate of said capacitor between said virtual ground node of said subcircuit and a predetermined reference voltage.

8. The capacitor structure of claim 7, wherein said second connecting device comprises a switch for switching the other plate of said capacitor, comprised of said first and third conductive layers, between an input signal and a predetermined reference voltage.

9. The capacitor structure of claim 1 wherein the predetermined voltage is ground.

10. A multilayered capacitor for use in a switched-capacitor structure having first and second plates with one of the plates thereof operable to be connected to a voltage sensitive node in a switched-capacitor structure, the plates of the capacitor formed over a semiconductor substrate, comprising:

a first conductive layer disposed over a portion of the first face of the semiconductor substrate and separated therefrom by a first insulating layer;

a second and shielded conductive layer disposed over a portion of said first conductive layer and separated therefrom by a second insulating layer;

a shielding structure disposed in substantially the same plane as said second shielded conductive layer and disposed a predetermined distance therefrom on the outer peripheral edge thereof and a connection device for connecting said shielding layer to a predetermined voltage with said shielding layer being conductive;

a third conductive layer disposed over a portion of said second conductive layer and separated therefrom by a third insulating layer; and a plurality of connecting devices being connected between said first and third conductive layers along the peripheral edges thereof and extending through said second and third insulating layers to conductively connect said first and third conductive layers, said connecting devices separated from said second shielded conductive layer by said shielding layer such that said first and third conductive layers form one plate of the capacitor and said second shielded conductive layer provides the sensitive plate of the capacitor.

11. The capacitor of claim 10, wherein said first conductive layer is comprised of a silicon-based material.

12. The capacitor of claim 10, wherein said first conductive layer is comprised of polycrystalline silicon.

13. The capacitor of claim 12, wherein said polycrystalline silicon is doped with a predetermined level of impurities.

14. The capacitor of claim 10, wherein said second and third conductive layers are each comprised of a metal layer formed with a two-metal CMOS process.

15. A capacitor structure in an integrated circuit, comprising:

a semiconductor substrate having a first face upon which the semiconductor integrated circuit is formed;

a differential input subcircuit having a differential virtual ground node, said subcircuit formed on the first face of said semiconductor substrate; and a capacitor having first and second plates formed on the first face of said semiconductor substrate, said capacitor having:

a first conductive layer disposed over a portion of the first face of said semiconductor substrate and separated therefrom by a first insulating layer, a second and shielded conductive layer disposed over a portion of said first conductive layer and separated therefrom by a second insulating layer, a third conductive layer disposed over a portion of said second conductive layer and separated therefrom by a third insulating layer, a first connecting device for connecting said second conductive layer to said differential virtual ground node of said subcircuit, said second conductive layer comprising the first plate of said capacitor, a second connecting device for connecting said first and third conductive layers together to form the second plate of said capacitor and to shield the portion of said second conductive layer disposed therebetween from noise and external signals; and a fourth conductive layer disposed in substantially the same plane as said second shielded conductive layer and disposed a predetermined distance therefrom and a third connecting device for connecting said fourth conductive layer to ground.

16. The capacitor structure of claim 15, wherein said first conductive layer is comprised of polycrystalline silicon.

17. The capacitor structure of claim 15, wherein said second and third conductive layers are comprised of a metal layer formed with a two-metal CMOS process.

18. The capacitor structure of claim 15 wherein said second connecting device is operable to connect said first and third conductive layers to the output of said subcircuit, such that said capacitor is disposed in a feedback configuration.

19. The capacitor structure of claim 15, wherein said first connecting device comprises a switching device for switching the first plate of the capacitor between said differential virtual ground node of said subcircuit and a predetermined reference voltage.

20. The capacitor structure of claim 19, wherein said second connecting device comprises a switch for switching the other plate of the capacitor, comprised of said first and third conductive layers, between an input signal and a predetermined reference voltage.

* * * * *